United States Patent
Reijnders

(10) Patent No.: US 6,464,121 B2
(45) Date of Patent: Oct. 15, 2002

(54) SPECIALIZED TOOL ADAPTED FOR A PROCESS FOR MANUFACTURE AND INTERCONNECTION BETWEEN ADJOINING PRINTED WIRING BOARDS

(75) Inventor: Harry J. M. Reijnders, Venray (NL)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/746,494

(22) Filed: Dec. 21, 2000

(65) Prior Publication Data

US 2002/0079342 A1 Jun. 27, 2002

(51) Int. Cl.⁷ .............................................. B65H 35/10
(52) U.S. Cl. ............................ 225/103; 83/695; 29/846
(58) Field of Search ........................... 29/846; 225/103, 225/104, 105.2, 93; 83/660, 693, 695, 929.1, 929.2

(56) References Cited

U.S. PATENT DOCUMENTS

| | | | | |
|---|---|---|---|---|
| 92,600 A | * | 7/1869 | Gaston ........................ | 83/660 |
| 486,917 A | * | 11/1892 | Walker ....................... | 225/103 |
| 3,205,750 A | * | 9/1965 | Strange ....................... | 30/355 |
| 3,463,039 A | * | 8/1969 | Silver ......................... | 156/584 |
| 3,520,220 A | * | 7/1970 | Acker ......................... | 83/529 |
| 3,554,069 A | * | 1/1971 | Wohlman, Jr. ............... | 234/111 |
| 3,711,922 A | * | 1/1973 | Busler et al. .................. | 227/2 |
| 3,841,189 A | * | 10/1974 | Spengler et al. ........... | 76/107.8 |
| 4,425,706 A | * | 1/1984 | Southworth et al. .......... | 30/116 |
| 4,898,056 A | * | 2/1990 | Grobb et al. ................. | 83/622 |
| 5,232,430 A | * | 8/1993 | Nitsch ......................... | 383/35 |
| 5,537,905 A | * | 7/1996 | Zimmer et al. ............... | 83/660 |
| 5,709,138 A | * | 1/1998 | Rimer ........................... | 83/18 |

FOREIGN PATENT DOCUMENTS

| | | | | |
|---|---|---|---|---|
| SU | 789444 A | * | 7/1980 | ................. 225/703 |
| SU | 789444 A | * | 12/1980 | ................. 225/103 |

* cited by examiner

Primary Examiner—M. Rachuba
Assistant Examiner—Jason Prone

(57) ABSTRACT

A tool for separating a common printed wiring board substrate into a plurality of substrates where, prior to separation, the plurality of substrates are connected by at least one circuit connector. The purpose of the tool is to apply pressure along a dividing line to break the common substrate into separate boards without crimping or breaking the connectors between the boards. In a preferred embodiment, the tool has a beveled edge for contacting the common substrate with mechanism for adjusting the location of notches in the beveled edge. The notches are for alignment with the location of the connectors between the boards.

17 Claims, 7 Drawing Sheets

SPECIALIZED TOOL ADAPTED FOR A PROCESS FOR MANUFACTURE AND INTERCONNECTION BETWEEN ADJOINING PRINTED WIRING BOARDS

CROSS REFERENCE TO CO-PENDING APPLICATIONS

This application is related to U.S. co-pending application, Ser. No. 09/746,774 entitled "PROCESS FOR CONTEMPORANEOUS MANUFACTURE AND INTERCONNECTION BETWEEN ADJOINING PRINTED WIRING BOARDS", filed concurrently herewith.

BACKGROUND OF THE INVENTION

The field of the proposed invention relates to the manufacture and assembly of printed wiring boards (PWBs) and more particularly to methods, equipment, and improved printed wiring boards in which multiple boards can be manufactured, connected, and tested together before separation into adjoining boards.

The electrical joining of multiple PWBs is a common feature in many computers and in much additional modem electronic equipment. PWBs are typically joined by orthogonally mounting one board into a socket fixture connected to an adjoining board. Such orthogonal mounting allows the PWBs to occupy less space within the same plane, thereby more compactly using the available cabinet space.

Whenever separate PWBs are joined, they must be both electrically connected and held rigidly in position in relation to each other. Both functions are often provided by a socket fixture. Although wire connections separate from the socket fixture are well known in the art, the typical socket fixture both holds the joined boards rigidly in position in relation to each other and provides electrical connection for each circuit that runs from one board to the other. To accomplish such electrical connections, it is necessary for circuits within the socket fixture to be aligned precisely with the relevant circuits on each board and then, typically to be soldered at the circuit juncture on each board in order to assure good electrical contact and rigidity at the point of electrical contact. Where separate wires are used for electrical contact between the boards rather than circuits within the socket fixture itself, such wires have conventionally been manually soldered using pre-insulated wires. The process of joining the boards typically requires manual insertion of at least one of the boards into the socket fixture in order not to damage pins or edges of the inserted board.

FIGS. 1–2 show two conventional socket fixtures of the prior art. Beginning with FIG. 1, an elevational cross sectional view of socket fixture 11 is shown joining two PWBs in an orthogonal fashion. Socket fixture 11 is mounted on top of base PWB 10 by means of soldered fasteners 12A and 12B. The cross sectional view of socket fixture 11 reveals that the fixture has a u-shape receptor into which orthogonal PWB 13 is inserted. Electrical connections to base PWB 10 are made by contact pins 15 at the base of socket fixture 11 where it is fastened to base PWB 10. Often, soldered fasteners 12A and 12B also serve as the electrical contacts, and the holes into which they are inserted are drilled into PWB electrical contact pads of the type discussed below in relation to the improved process of the present invention. Returning to FIG. 1, electrical connection between socket fixture 11 and orthogonal PWB 13 is made by contact pins 14 (shown in dotted outline) extending beyond the edge of PWB 13. Pins 14 are inserted into pin sockets at the base of the unshaped receptor of fixture 11. During manufacture, both PWBs 10 and 13 are printed separately. Although the placement and attachment of socket fixture 11 to base PWB 10 is often automated, the insertion of PWB 13 into socket fixture 11 is done manually to avoid damaging pins 14.

Turning now to FIG. 2, a second example of a conventional socket fixture is shown. Here, socket fixture 21 comprises a straight connector that is placed into pre-drilled holes and soldered into base PWB 20 using soldered fasteners 22, which may also serve as electrical contacts. The structural and electrical connections between fixture 21 and base PWB 20 are thus the same as shown in FIG. 1. Instead of a unshaped receptor, however, fixture 21 mates with orthogonal PWB 23 by a repeat of the processes used to fasten fixture 21 into base PWB 20. In other words, orthogonal PWB 23 is aligned parallel to and in contact with socket fixture 21. Fasteners 24A and 24B are then inserted into pre-drilled and aligned holes in both orthogonal PWB 23 and socket fixture 21. When soldered into place, fasteners 24A and 24B both rigidly hold PWB 23 orthogonally to base PWN 20 and provide electrical contact between the PWBs.

As noted above, stacked PWBs, whether stacked orthogonally as shown in FIGS. 1 and 2 or otherwise, require hand manipulation during assembly. Often, the hand manipulation extends to selection from inventory of the correct boards for assembly since each board is manufactured independently of the other. A further consequence of conventional manufacture and assembly processes is that each board undergoes its own manufacturing and handling processes independent of the other. In other words, each of the manufacturing, assembly, and testing processes of a PWB is performed separately upon each of the stacked PWBs prior to the point at which the PWBs are brought together for joining and interconnection. Among the typical processes that each PWN undergoes are: A) circuit printing, B) component stuffing (whether by axial, radial or SMD processes), C) initial testing, D) touch-up fixes, E) final PWB Quality Control, F) inventorying, and G) delivery to final assembly station for interconnection.

It would be advantageous to fully automate the above processes such that no manual manipulation is necessary when bringing the PWBs from inventory or when performing the joining operation itself. Moreover, it would be advantageous to streamline and lower the cost of manufacture, assembly, and testing by creating a process for simultaneous manufacture, assembly, and testing of both boards to be joined such that all phases of manufacture, inventory, final assembly, and testing are performed jointly and automatically. Lastly, it would be advantageous to create specialized tooling that enables the above advantageous processes of the present invention.

SUMMARY OF THE INVENTION

One aspect of the present invention is a tool for separating a common printed wiring board substrate into a plurality of substrates having at least one circuit connector connected between the substrates, comprising: a beveled edge of the tool for placement in contact with the substrates to be separated; and at least one notch in the beveled edge for alignment with at least one circuit connector.

Another aspect of the present invention is a process for separating a common printed wiring board substrate into a plurality of substrates having at least one circuit connector connected between the substrates, comprising: forming at least one notch in a beveled edge of a separation tool; aligning at least one notch with at least one circuit connector; and applying pressure between the separating tool and the common substrate.

BRIEF DESCRIPTION OF THE DRAWINGS

Other aspects of the present invention will become apparent as the following description proceeds and upon reference to the drawings, in which.

DETAILED DESCRIPTION OF THE DRAWINGS

While the present invention will hereinafter be described in connection with its preferred embodiments and methods of use, it will be understood that it is not intended to limit the invention to these embodiments and methods of use. On the contrary, the following description is intended to cover all alternatives, modifications, and equivalents, as may be included within the spirit and scope of the invention as defined by the appended claims.

One aspect of the present invention is a flexible process for manufacture, joining, and testing of a plurality of separate PWBs intended to be adjoined in final assembly. This streamlined manufacturing, assembly, and testing process enables use of less expensive and more automated electrical and mounting fixtures as well as produces manufacturing efficiencies by combining processes on one board that heretofore had been performed on separate boards that were manufactured separately, inventoried separately, handled separately, and then combined upon final assembly.

Figure 1:
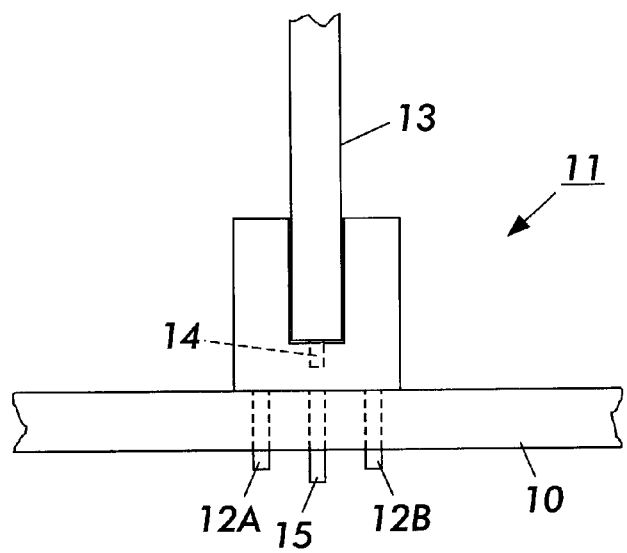
FIG. 1 is an elevational cross-sectional view of an orthogonal PWB socket fixture of the prior art.
Figure 3:
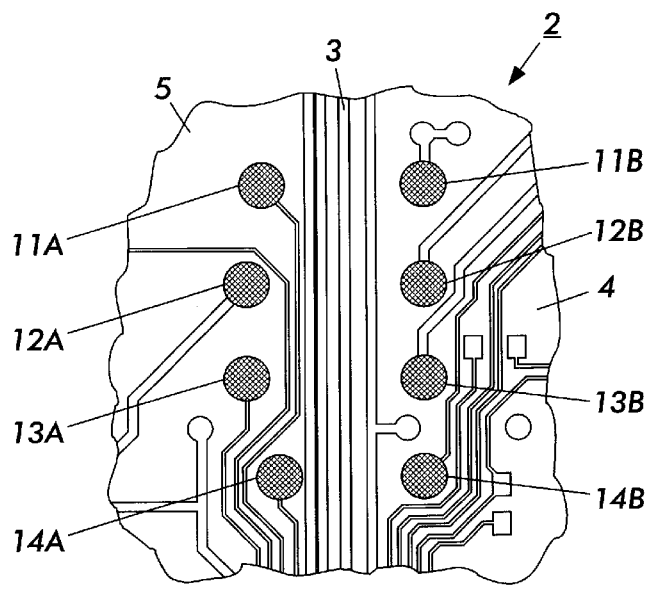
FIG. 3 is an orthogonal view of circuits printed on a PWB using the processes of the present invention.

Accordingly, the process of the present invention will now be described in relation to FIGS. 3–8. FIG. 3 shows an example of circuits printed on a portion of a single board substrate 2 using the process of the present invention. The term "printing" has the broadest meaning and is intended to cover the many ways that patterns are created upon PWBs, including, without limitation, analog or digital printing-like processes, lithographic processes, etching processes, and any other additive or subtractive processes for forming patterns in or upon PWBs. Connection pads 11A, 11B, 12A, 12B, 13A, 13B, 14A, and 14B are typically end points of circuits and are enlarged to enable drilling, soldering, and/or any other method of electrically connecting a component that is not printed upon the PWB. In the processes of the present invention, these pads are typically but not necessarily larger than circuit lines and are drilled to enable insertion of circuit connectors (to be discussed below). It should be noted that as shown in FIG. 3, the pads are arranged in pairs, e.g. 11A and 11B, such that each pad is aligned across a dividing line 3 from another pad. The use and importance of such alignments will be discussed below. It should be noted, however, that although a preferred embodiment of the present invention is to print pads in aligned fashion as shown in FIG. 1, the present invention will also operate with non-aligned pads as long as pads on opposite sides of dividing line 3 may ultimately be connected as discussed below. Also, although the present invention is described in relation to electrical circuits, the term "circuit" is intended to broadly cover any path for conducting electrical current. "Circuits" for photons within fiber optic or other electromagnetic pathways would also comprise "circuits" under the present invention.

Most PWB substrates currently are made of several layers of brittle plastic. Although a preferred embodiment of the present invention contemplates use of such a brittle substrate material, it is specifically contemplated that the present invention would work with a flexible substrate material or even with a substrate that is flexible only in the region of dividing line 3. What is essential to the present invention is that a division, presumably but not necessarily by a straight line, exists between the layout patterns of two separate PWBs that are printed on a single board substrate 2. In FIG. 3, the separate PWBs are labeled 4 and 5. Separate PWBs 4 and 5 will then be differentiated by tilting one PWB at an angle in relation to another (this process step is discussed below). If the single board substrate 2 is brittle, the act of tilting will presumably physically break and separate PWB 4 from PWB 5. If the single board substrate 2 is flexible, then such tilting may not result in a physical separation.

As shown in FIG. 3, dividing line 3 is a straight line (which need not be printed, marked, or imaged in any manner) that is within the zone that separates between PWB 4 from PWB 5 on single board substrate 2. In a preferred embodiment, pads 11A–14A and 11B–14B, which will be connected to form a circuit in a subsequent step of the inventive process, are printed in an aligned manner with their similarly numbered opposite on either side of dividing line 3. Although it is expected that such alignments of pads will usually comprise pairs of pads, it is conceivable that a single circuit on either PWB 4 or PWB 5 will be connected with a plurality of connection points on the other PWB. Additionally, although FIG. 1 shows single board substrate 2 with only PWBs 4 and 5, it is expressly contemplated that a plurality of PWBs may be laid out on a single board substrate and that the inventive process can be repeated for each PWB. Specifically, it is contemplated that up to 5 PWBs can be laid out on a brittle single board substrate such that at the conclusion of the process, one PWB will form a rectangular base PWB and the other PWBs may be adjoined on the four sides of the base PWB. Even more PWBs can be envisioned from a single board substrate if one or more of the tilted PWBs becomes a base PWB for other PWBs connected to it.

After the circuits are printed upon single board substrate 2 as shown in FIG. 3, the next process of the present invention is often determined by a decision concerning the manner in which PWBs 4 and 5 will ultimately be separated. If the zone of single board substrate 2 around dividing line 3 is flexible, then no physical separation need be made. If single board substrate is brittle, however, or if PWBs 4 and 5 will ultimately be physically separated, then a decision may be made at this step of the process to undergo a board scoring process in order to enable or facilitate breaking of the single board substrate 2 along the scored line. In a preferred embodiment, both top and bottom sides of single board substrate 2 are scored in a v-shape groove with side angles not exceeding 60 degrees. The results of such scoring can be seen in FIG. 5 which will further discussed in detail below. In the event of scoring on both sides of single board substrate 2, it is preferred that such scoring occur before making connections between the PWB 4 section of single board substrate 2 and the PWB 5 section. If scoring is to occur on only the side of single board substrate 2 that does not contain the inter-board connections, then it is immaterial whether scoring occurs before or after inter-connections are made. A similar analysis applies if PWBs 4 and 5 are to be separated by cutting or some other physical separation process.

Figure 4:
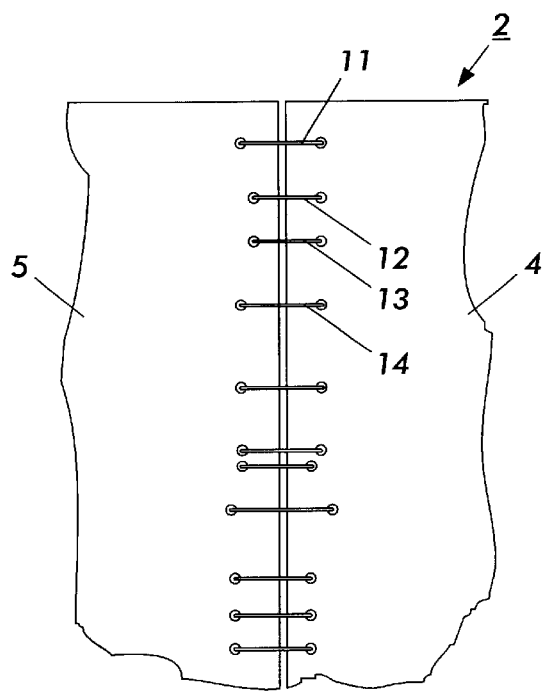
FIG. 4 is an orthogonal view of wire connections between two adjoining boards and across a line dividing the adjoining boards.

Turning now to FIG. 4, an orthogonal elevational view is presented in which dividing line 3 is again shown although the circuits shown in FIG. 3 are not. Instead, the horizontal lines 11–14 in FIG. 4 represent circuit connections made between the PWB 4 section of single board substrate 2 and the PWB 5 section. Although it is preferred that these connections be made while both PWBs remain in situ as part of an undivided and planar single board substrate 2, these connections could be made after the PWB sections are physically separated, especially if the separated PWBs 4 and 5 remain in co-planar relationship and proximate to each other in a cutting or separating fixture.

In a preferred embodiment, circuit connectors 11–14 comprise pre-insulated flexible wires. Alternative embodiments are possible. Specifically, non-insulated wires could be applied and left in a non-insulated manner or an insulation coating could be applied subsequently. Ribbon wires may be used rather than discrete circuit connectors. The circuit connectors may also be formed of flexible conductive plastic or other circuit connecting material that is printed or otherwise laid down or connected across dividing line 3 and between pads 11A–14A and 11B–14B in the manner shown in FIG. 4. Circuit connectors 11–14 could also be made subsequent to the tilting step to be described later. However, when done in this manner, handling is more difficult and some of the manufacturing and testing advantages of the present invention cannot as easily be achieved.

Figure 5:
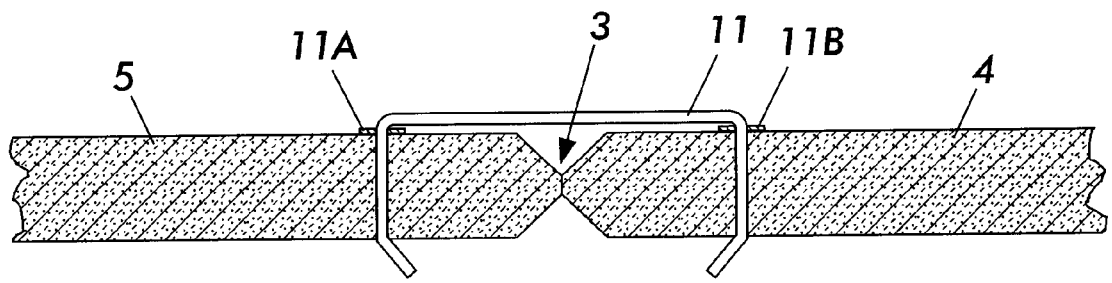
FIG. 5 is an elevational cross-sectional view of a scored single board substrate with wire connections between two adjoining board section.

Turning now to FIG. 5, an elevational cross-sectional view of a preferred embodiment of one step of the present process is shown after connectors 11–14 are made between the PWB 4 section of single board substrate 2 and the PWB section 5 but before physical separation or tilting of the PWBs. As shown, a circuit connector 11 comprises a pre-insulated wire forming a connection between pad 11A and pad 11B. As discussed above and as shown in FIG. 5, pads 11A and 11B have been pre-drilled for insertion of connected components, in this case wire 11. Also, it is preferred that wire 11 be soldered into the drilled holes in order to ensure good and robust circuit contact between pads 11A, 11B, and wire 11.

Also as shown in FIG. 5, single board substrate 2 has been scored on both bottom and top sides, presumably before connectors 11–14 had been applied. As discussed above, the scored groove traces dividing line 3 and is preferably scored at angles less than 60 degrees.

Figure 6:
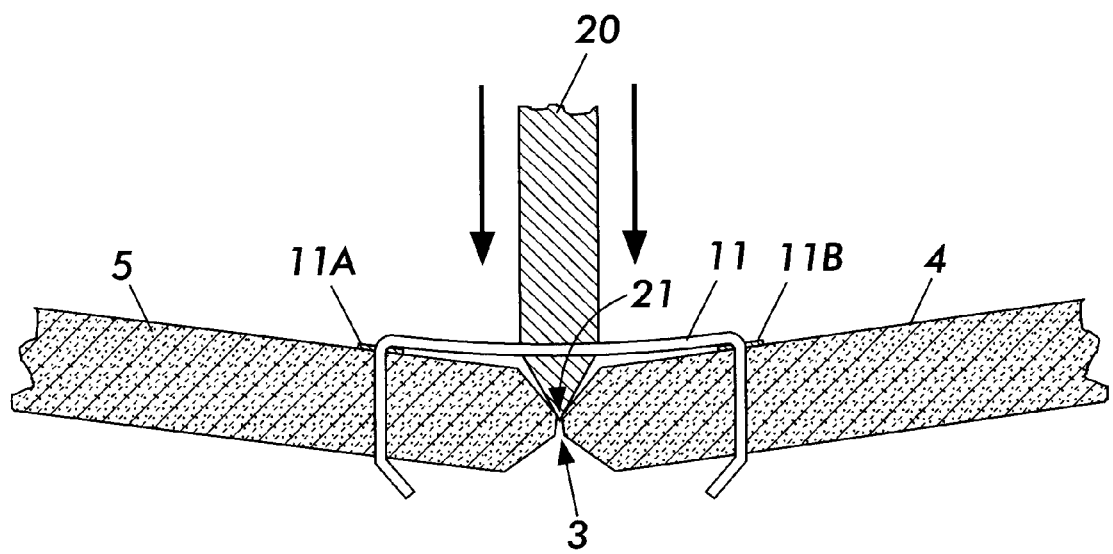
FIG. 6 is an elevational cross-sectional view of a beveled dividing tool applying pressure along a line to divide the single substrate board into two electrically connected adjoining boards.

Turning now to FIG. 6, an elevational cross-sectional view of a PWB separating process is shown. Unique separating tool 20 is shown in cross-section with its beveled edge. Tool 20 will be discussed in more detail below. As shown, the purpose of tool 20 is to apply pressure to single board substrate 2 at the scored dividing line 3. When single board substrate 2 is brittle, then it breaks as shown along scored dividing line 3. This is a common process of separating PWBs in the prior art. It should be noted that FIG. 6 shows that wire 11 has begun to bend as PWB 4 is tilted in relation to PWB 5.

Figure 7:
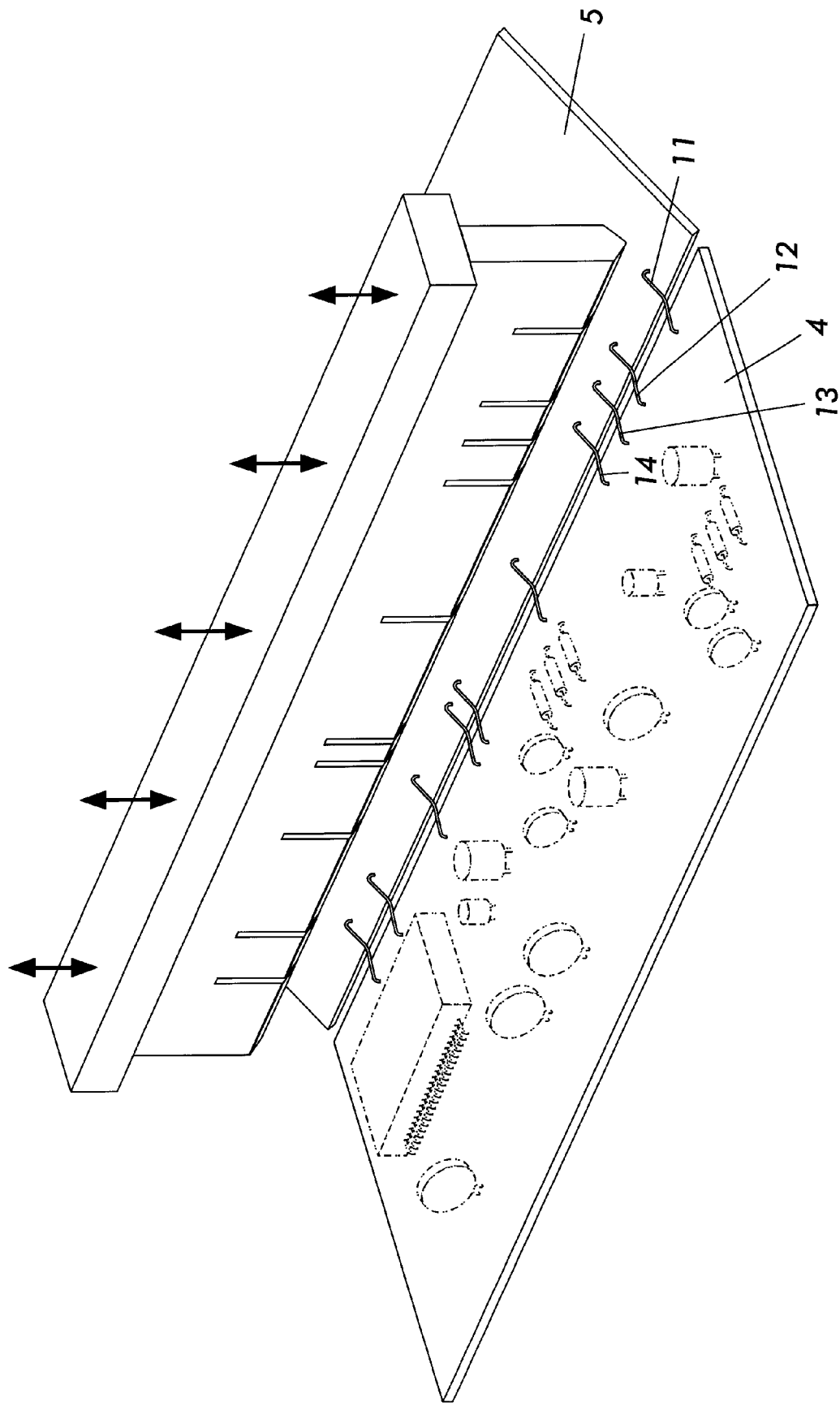
FIG. 7 is an elevational cross-sectional view of a corner fixture holding the adjoined boards of the present invention rigidly to the sidewalls of a cabinet that houses the boards.

Turning now to FIG. 7, a perspective view of the process step of FIG. 6 is shown. As shown, all of the components of both PWB 4 and PWB 5 can be assembled and completed prior to the separating and/or tilting step. Moreover, complete circuit and functional testing of individual boards PWB 4 and PWB 5 can be completed simultaneously, thereby avoiding inventory and handling expenses and problems. Moreover, because connectors 11–14 are already inserted on single substrate board 2 prior to separation or tilting, then the entire PWB assembly of both boards can be completely circuit and functionally tested prior to separation. This is a major advantage over the prior art since, as discussed above, such combined testing normally cannot be completed until after each board is separately manufactured, inventoried, handled, retrieved, and inserted in a socket fixture. Under the prior art, when the combination of boards fails a test, the correction process must both determine whether the defect occurred in the connecting and fixturing process or whether a defect occurred on one of the boards due to mishandling during handling and assembly. In the process of the present invention, testing need occur only once on both the individual and the connected combination of boards.

Figure 8:
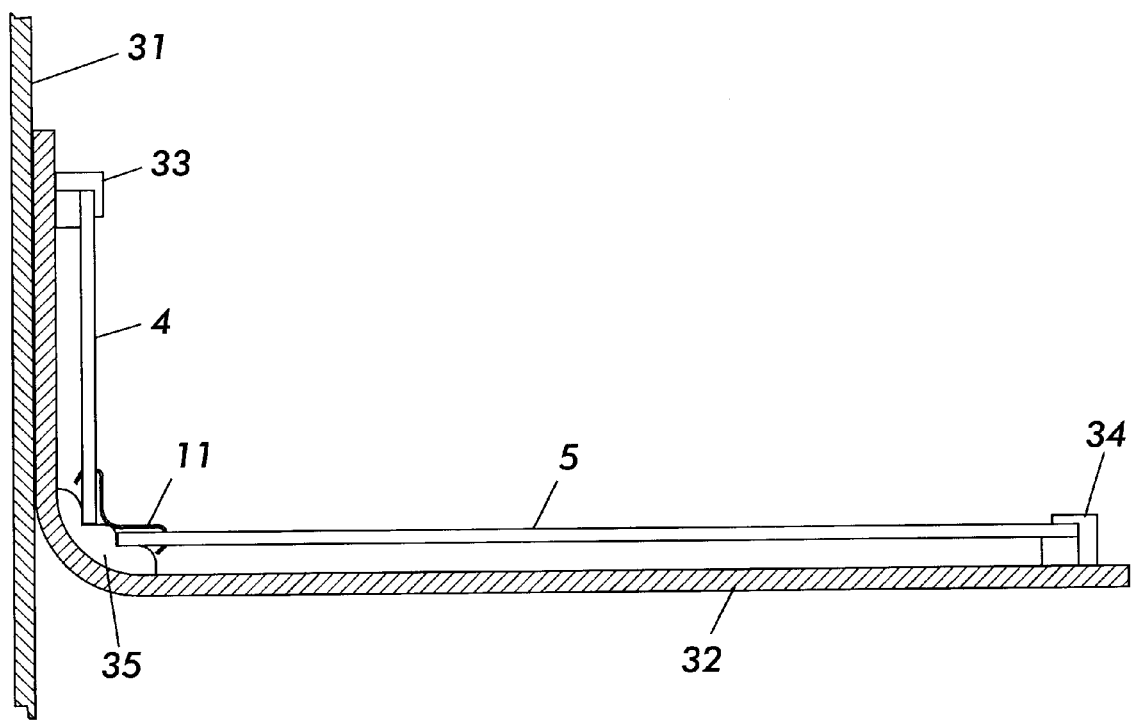
FIG. 8 is a perspective view of the beveled dividing tool after it has separated the single substrate board into two electrically connected boards.

Turning now to FIG. 8, a preferred fixture for holding PWB 4 in relation to PWB 5 is shown. Specifically, rigid frame members such as the outside sidewall of the cabinet containing the PWBs are ideal for rigidly holding the PWBs in place while minimizing the internal space occupied by the boards. As shown, PWB 4 is held securely in proximity to sidewall 31 and in an orthogonal relationship to PWB 5. PWB 5, in turn is held securely in proximity to sidewall 32. Clip 33 holds the top edge of PWB 4 to sidewall 31. A similar function is performed on PWB 5 by clip 34. At the juncture of PWB 4 and PWB 5, fixture 35 holds an edge of PWB 4 as well as an edge of PWB 5. When combined with clips 33 and 34, fixture 35 holds both PWBs securely in place. Circuit connector 11 is shown in outline laying on the inside of both PWB 4 and PWB 5 and neatly bent to conform to the orthogonal relationship between the two boards.

Figure 2:
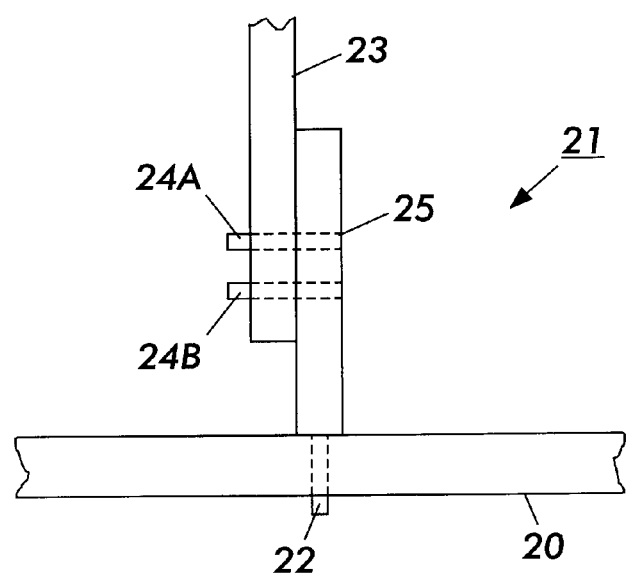
FIG. 2 is an elevational cross-sectional view of a second orthogonal PWB socket fixture of the prior art.

When compared to typical practices under the prior art, fixture 35 represents a significant simplification and cost saving. Specifically, as shown in FIGS. 1 and 2, the joining fixtures of the prior art must generally combine both the structural function of holding the PWBs in fixed position in relation to each other and must, additionally, provide circuit connections between the boards. As noted above, the process of assembling the PWBs by insertion of one into or the other into the fixture is a prime opportunity for mishandling one or the other PWB. Also as noted above, circuit and joint functional testing cannot be completed until this adjoining occurs. Moreover, in the unusual circumstance where wires or other circuit connections are not made through the socket fixture itself, then these must be separately wired in situ while the boards are structurally held in place. Each of these complexities is avoided under the present invention. Instead, fixture 35 is a simple mechanical fixture with no function directly related to connecting the circuits between the boards. As such, its design, cost, handling, and placement can all be simplified.

Although FIG. 8 shows a preferred embodiment using the sidewalls of a container in which the PWB assembly is placed, any other arrangement for positioning PWB 4 and PWB 5 in relation to each other is possible. Specifically, the PWBs may simply be fixtured orthogonally or at least tilted to each other by a fixture that does not structurally rely upon any component not already on the PWBs. Structurally (but not electrically), this can resemble the fixtures of FIGS. 1 and 2. A fixture similar to fixture 35 and clips 33 and 34 can also use any other rigid or semi-rigid frame member associated with the PWB assembly of PWB 4 and PWB 5. For instance, if the PWB assembly is a subcomponent of a larger assembly, such larger assembly may have its own casing or support or attachment members.

It should be additionally noted that unlike manufacture and assembly processes of the prior art, the processes of the present invention are ideally suited for a fully automated PWB manufacture and assembly process whereby printing, component (including connectors 11–14) insertion, breaking, testing, assembly, and fixturing can all be performed in one continuous and automated manufacturing operation.

In sum, an innovative process has been presented wherein a plurality of PWBs can be printed, connected, tested, and assembled by performing most operations on a single board substrate and then tilting at least a portion of the single board substrate to effectively form a plurality of PWBs with circuits that have been interconnected prior to the tilting operation.

Yet another aspect of the present invention is an innovative tool designed to efficiently break a single board substrate into a plurality of separate PWBs while such separate PWBs remain connected by circuit connections. It is well known in the art to break PWBs apart by applying a beveled knife edge to a scored groove and then pushing the knife edge against the scored boards or vice versa. As discussed above, however, the process of the present invention is optimized if circuit connectors 11–14 are applied prior to separation of the PWBs. A normal continuous knife edge of the prior art would therefore press upon and crimp or break circuit connectors 11–14. A logical method of avoiding this result is to cut or form notches or deletions in the knife edge in precisely the regions where the circuit connectors 11–14 each cross dividing line 3. Such an edged tool with notches or deletions in regions of its edge would be a simple and novel tool for ensuring that circuit connectors 11–14 are not damaged during the PWB separation process. However, tools are inherently expensive to prepare and maintain. Once notches or deletions are formed, then it becomes difficult to adapt the tool to different configurations of PWBs that may have circuit connectors 11–14 at different spaces in relation to each other.

Figure 9:
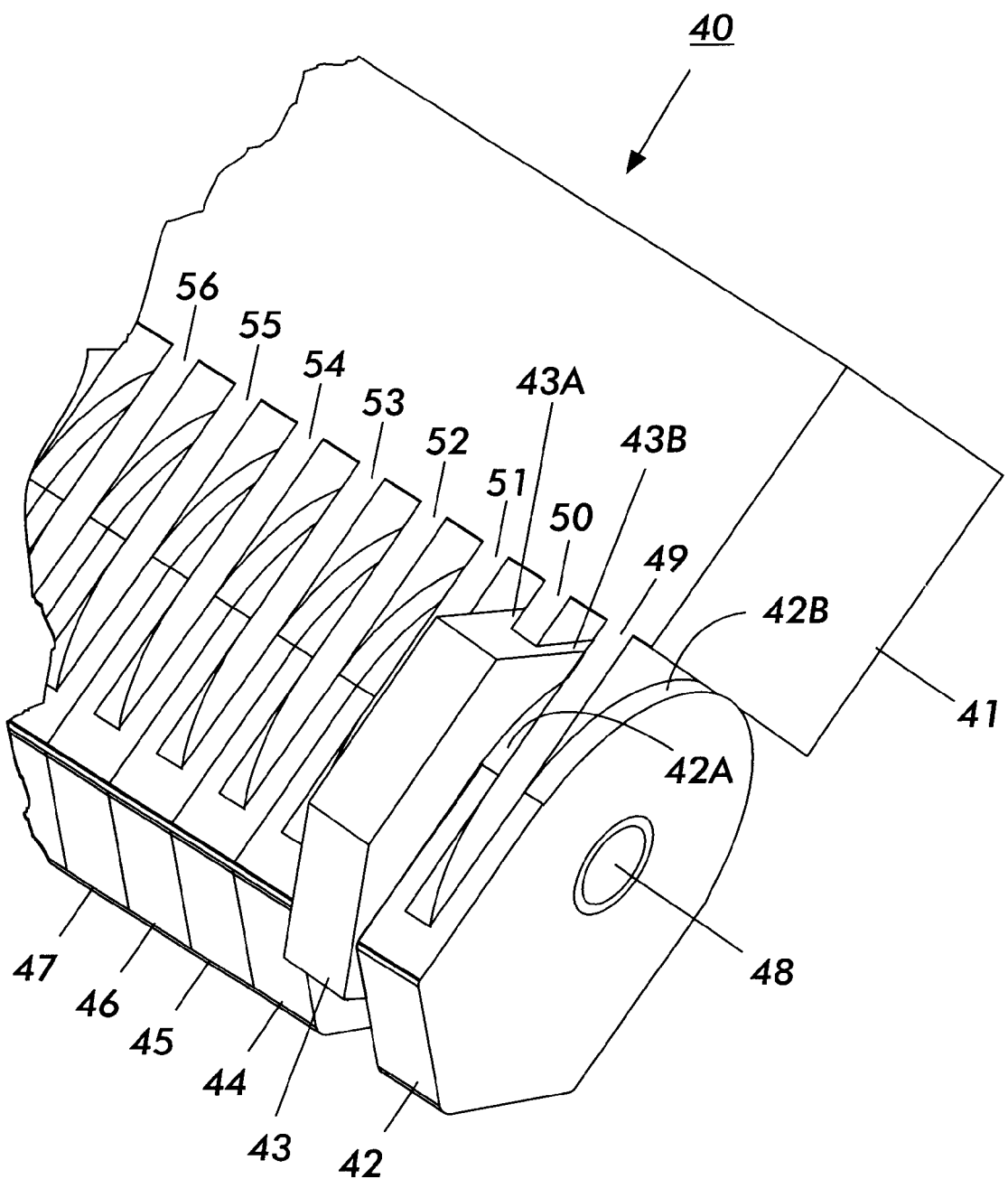
FIG. 9 is a perspective view of an embodiment of a dividing tool of the present invention wherein subsections of the tool are movable upon hinge elements.

Accordingly, another aspect of the present invention is creation of a novel tool with a beveled knife edge capable of having regions deleted to conform to the specific placement of circuit connectors 11–14 as may be present on the PWBs being processed. A first preferred embodiment of the novel tool is shown in FIG. 9 as tool 40. Tool 40 comprises a body 41 that typically but not necessarily is made of metal. At the base of body 41 is a series of knife components. In FIG. 9, knife components 42–47 are used to exemplify any number of knife components that may be uses. There may, of course, be any number of these knife components and each may be the same width or may vary in width. The end knife components may be rigidly attached to body 41 or may be adjustable in the manner discussed below. It is anticipated that for a typical PWB made using the process of the present invention, each knife component would be at least ¼ inch along its edge dimension although shorter or longer lengths would work equally well depending upon the spacing of circuit connectors 11–14 and upon the tendency, if any, of circuit connectors 11–14 to bend away from a straight line between connection pads 11A–14A and 11B–14B.

As shown in FIG. 9, each knife component 42–47 is mounted to body 41 on a hinge. In the configuration shown, the hinge comprises a rod 48 running lengthwise along the entire length of the edge of tool 40. Fingers 49–56 fixedly extend from body 41 with aligned through holes such that rod 48 runs through each of the through holes until terminated at each end components. Each knife component 42–47 similarly has fingers 42A and 42B through 47A and 47B, and each such finger has bored holes through which rod 48 extends. The result is that rod 48 is held rigidly in position in relation to body 41 and each knife component 42–47 is free to be extended in a downward engaged position or to be swung upward to form a notch in the edge of tool 40. Since each knife component is independently adjustable, tool 40 can be adapted for any variety of PWB configurations made with the processes of the present invention.

Figure 10:
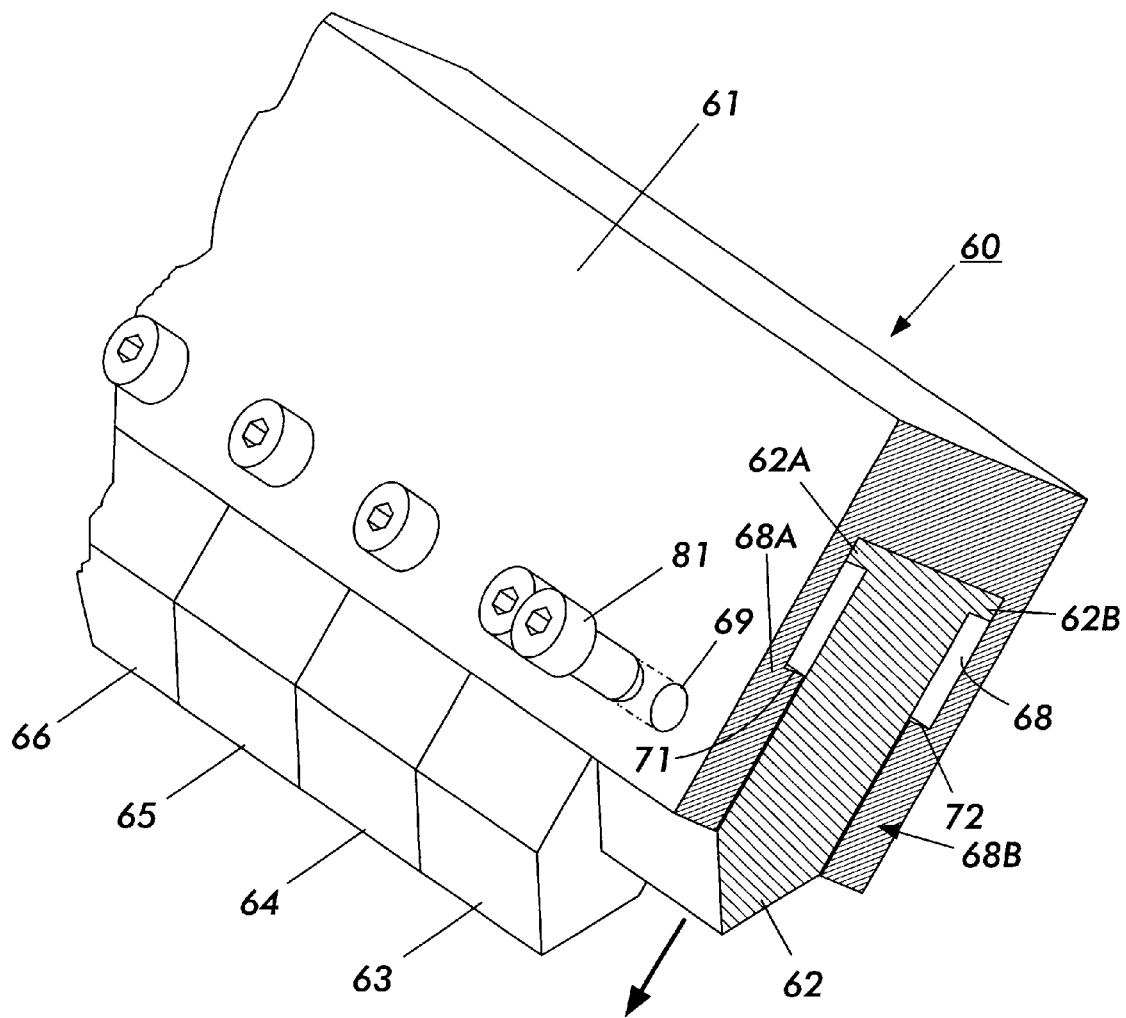
FIG. 10 is a perspective view of an embodiment of a dividing tool of the present invention wherein subsections of the tool are retractable into recesses in the body of the tool.

A second embodiment of a tool of the present invention is shown in FIG. 10. In this figure, tool 60 has a body 61 and beveled knife components 62–66 much with the same characteristics and variables of design as discussed above in relation to tool 40. Instead of a hinge member, however, notches in the tool 60's edge can be formed because knife components 62–66 are capable of individual retraction into a cavity formed in body 61. Cavity 68 is formed by sidewalls 68A and 68B that rigidly extend along most or all of the length of the edge of tool 61. Sidewalls 68A and 68B form "front" and "back" walls of cavity 68. Knife components 62–66 each have legs 62A–66A and 62B–66B (only 62A and 62B are shown) protruding in proximity to the portion of the applicable knife component furthest into cavity 68. Sidewalls 68A and 68B each have internal ledges 71 and 72 that run the length of each sidewall. When a knife component 62–66 is extended for contact with single board substrate 2, the applicable legs 62A–67A and 62B–66B are stopped on ledges 71 and 72 such that each knife component is extended the same amount. When extended in this manner, knife components 62–66 are then locked into position in order to withstand the pressure of being pushed against single board substrate 2. In FIG. 10, the locking mechanism shown in relation to knife component 62 comprises bolt 81 which is inserted through sidewall 68A through bored hole 69. When knife component is in its extended position, bored hole 69 aligns with a receiving hole (not shown) on the surface of knife component 62 facing sidewall 68A. The result is that bolt 81 passes through bored hole 69 and into the receiving hole, thereby locking knife component 62 in place. Bolt 81 itself may be secured in place in any manner, most preferably by a series of threaded connections either at the tip of bolt 81 which may thread into threads within the receiving hole of knife component 62 or by threads near the head of bolt 81 which thread into receiving threads in bored hole 69.

Any number of refinements and embodiments to the above described tools are possible. For instance, knife components could be removable rather than retractable or connected to the tool body by a hinge member. If removable, the knife components can be held in place once inserted by interaction of retaining legs and cavity ledges, and bolts similar to those described above in relation to tool 60.

In sum, an inventive process has been disclosed for efficient, low cost, and robust manufacture, testing and assembly of a plurality of adjoining PWBs. A novel tool to aid in performance of this process has also been disclosed.

It is, therefore, evident that there has been provided in accordance with the present invention a process and tool that fully satisfies the aims and advantages set forth above. While the invention has been described in conjunction with several embodiments, it is evident that many alternatives, modifications, and variations will be apparent to those skilled in the art. Accordingly, it is intended to embrace all such alternatives, modifications, and variations as fall within the spirit and broad scope of the appended claims.

What is claimed is:

1. A printed wiring board and associated separation tool for separating the printed wiring board into a plurality of substrates, said combination comprising:
   (a) a printed wiring board comprising a plurality of substrate sections, at least one separation zone between the sections, and at least one circuit connector connected between the sections;
   (b) a tool having an acutely angled edge for placement in contact with the separation zone; and
   (c) at least one notch in the acutely angled edge of the tool for alignment with at least one circuit connector.

2. The tool of claim 1, wherein at least one notch is fixedly positioned in the acutely angled edge.

3. The tool of claim 1, wherein the location of at least one notch can be adjusted.

4. The tool of claim 1, wherein there are a plurality of notches.

5. The tool of claim 4, further comprising:
   (a) a body of the tool; and
   (b) a knife component adjustable to a plurality of positions in relation to the body.

6. The tool of claim 5, wherein:
   (a) the acutely angled edge has a length dimension; and
   (b) the adjustable knife component is movable along the length dimension of the acutely angled edge.
   (b) the adjustable knife component is movable along the length dimension of the beveled edge.

7. The tool of claim 5, wherein the knife component comprises a plurality of knife components with acutely angled edges alignable to form the acutely angled edge of the tool.

8. The tool of claim 7, wherein at least one knife component is capable of at least partial retraction into the tool body.

9. The tool of claim 7, wherein at least one knife component is connected to the body by a pivot hinge such that its edge can be removed from contact with the substrate when the tool is placed in contact with the substrate.

10. The tool of claim 7, wherein at least one knife component is detachable from the body.

11. The tool of claim 9, further comprising a hinge member positioned approximately parallel to the acutely angled edge of the tool such that a plurality of knife components may pivot upon the hinge member.

12. The tool of claim 9, further comprising a mechanism for holding at least one knife component in its removed position.

13. The tool of claim 5, the body further comprises two parallel sidewalls forming a cavity therebetween and wherein the knife is at least partially retractable into the cavity.

14. The tool of claim 13, wherein there are a plurality of retractable knife components.

15. The tool of claim 13, further comprising a mechanism for holding at least one knife component in its retracted position.

16. A tool for separating a printed wiring board into a plurality of substrates with each substrate having at least one circuit connector connected between the substrates, comprising;
   (a) a beveled edge for placement in contact with the printed wiring board , wherein there are a plurality of spaced apart circuit connectors; and
   (b) a plurality of notches in the beveled edge wherein the plurality of notches are spaced apart such that at least one notch aligns with each circuit connector.

17. A tool for separating a printed wiring board into a plurality of substrates with each substrate having at least one circuit connector connected between the substrates, comprising:
   (a) a beveled edge for placement In contact with the printed wiring board wherein the beveled edge comprises an acutely angled edge with at least one arcurately shaped side; and
   (b) at least one notch in the beveled edge for alignment with at least one circuit connector.

* * * * *